(12) United States Patent
Zhang et al.

(10) Patent No.: US 8,748,798 B2
(45) Date of Patent: Jun. 10, 2014

(54) COMPARATOR CIRCUIT FOR REDUCED OUTPUT VARIATION

(75) Inventors: Guangbin Zhang, Cupertino, CA (US); Dennis Lee, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 102 days.

(21) Appl. No.: 13/604,554

(22) Filed: Sep. 5, 2012

(65) Prior Publication Data

US 2014/0061433 A1    Mar. 6, 2014

(51) Int. Cl.
*H01J 40/14*    (2006.01)

(52) U.S. Cl.
USPC ............... 250/214 R; 250/214 AG; 330/310

(58) Field of Classification Search
USPC ............ 250/214 R, 214 A, 214 LS, 214 AG, 250/214 C; 330/110, 278, 282, 308, 310; 327/77, 87; 348/302, 303
See application file for complete search history.

(56) References Cited

U.S. PATENT DOCUMENTS

2005/0174277 A1*    8/2005    Tani et al. ...................... 341/156
2013/0182164 A1*    7/2013    Duggal et al. ................. 348/302

OTHER PUBLICATIONS

Sakakibara, M. et al., "A High-Sensitivity CMOS Image Sensor With Gain-Adaptive Column Amplifiers," IEEE Journal of Solid-State Circuits, vol. 40, No. 5, May 2005, pp. 1147-1156.
Solhusvik, J. et al., "A 1.2MP 1/3" Global Shutter CMOS Image Sensor with Pixel-Wise Automatic Gain Selection," 2011 International Image Sensor Workshop, Hakodate-Onuma Prince Hotel, Hokkaido, Japan, Session 12 Global Shutter Sensors, Jun. 11, 2011, R53 (3 pages).

* cited by examiner

*Primary Examiner* — Kevin Pyo
(74) *Attorney, Agent, or Firm* — Blakely Sokoloff Taylor & Zafman LLP (57) ABSTRACT

A comparator circuit for generating a signal representing a comparison of an input signal and a reference signal. In an embodiment, the comparator circuit includes a first stage and a second stage to provide respective signal amplification, where switch circuitry of the second stage switchedly couples respective elements of the first and second stages. The comparator circuit further includes a third stage to generate an output signal based on an intermediate signal of the second stage. In another embodiment, feedback circuitry of the comparator circuit is to selectively control a voltage of the output stage based on the output signal.

20 Claims, 7 Drawing Sheets

COMPARATOR CIRCUIT FOR REDUCED OUTPUT VARIATION

BACKGROUND

1. Technical Field

This disclosure relates generally to signal comparison circuitry and in particular, but not exclusively, to image sensor readout circuitry.

2. Background Art

Comparator circuits are often found in semiconductor devices such as CMOS image sensors. A popular form of comparator circuit is an asynchronous comparator circuit, which receives an input signal and provides an output signal representing a comparison of the input signal to some reference signal. In an asynchronous comparator circuit, the input signal directly triggers generation of the output signal. Thus, output signals of asynchronous comparator circuits are typically prone to signal noise. For example, such output signals tend to exhibit threshold jumping which is interpreted by other digital logic as a rapid switching between binary logical states.

Another type of comparator circuit is a synchronous comparator circuit, which is operated with a clock or other strobe signal to enable a comparison decision based upon the input signal. Triggering of an output signal in a synchronous comparator circuit further depends upon such a strobe signal. However, output signals of synchronous comparator circuits are typically prone to oversaturation when a strobe signal triggers generation of the output signal. As a result, such output signals tend to exhibit a sudden and extended switching from a logical state which correctly represents a comparison to the opposite, incorrect logical state.

As integrated circuit fabrication techniques continue to improve, successive generations of smaller and/or faster semiconductor devices are increasingly sensitive to the performance limitations in such comparator circuits.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide a comparator circuit with improved output signal characteristics, as compared to previous comparator circuit architectures. A comparator circuit according to an embodiment may, for example, include one or more structures to limit current injection prior to and/or during sampling of an input signal which is to be compared to a reference signal. Additionally or alternatively, such a comparator circuit may include feedback circuitry to lock a level of the output signal based upon sampling of the input signal—e.g. to avoid output oscillation.

Figure 1:
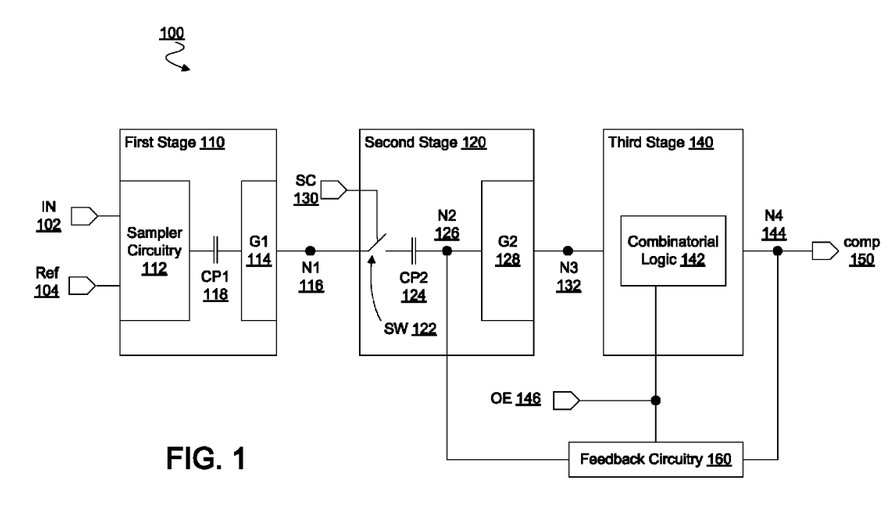
FIG. 1 is a hybrid block/circuit diagram illustrating elements of a comparator circuit according to an embodiment.

FIG. 1 illustrates elements of a comparator circuit 100 according to an embodiment. In an embodiment, comparator circuit 100 includes first stage 110 to receive input signal IN 102 and reference signal Ref 104, where comparator circuit 100 is to generate output signal comp 150 representing a comparison of IN 102 and Ref 104. IN 102 may, for example, represent image information generated by a pixel array of an image sensor, although certain embodiments are not limited in this regard. Ref 104 may be an a priori input, and a value and/or source of Ref 104 may not be limiting on certain embodiments. Certain features of various embodiments are discussed herein with respect to comparing a signal representing image information. However, such discussion may be extended to apply to comparison of any of a variety of additional or alternative types of signals, according to different embodiments.

Comparator circuit 100 may include a sequence of stages—e.g. including first stage 110, second stage 120 and third stage 140—for generating comp 150. In an embodiment, comparator circuit 100 further includes feedback circuitry 160 for providing feedback from third stage 140 to change second stage 120.

In an embodiment, first stage 110 includes sampler circuitry 112 to selectively sample IN 102 and Ref 104. Sampler circuitry 112 may receive one or more control signals (not shown) which control respective sampling of IN 102 and Ref 104. Sampler circuitry 112 may include circuitry to limit charge injection due to sampling of IN 102 and/or Ref 104, although certain embodiments are not limited in this regard.

Sampling of IN 102 and Ref 104 may include sampler circuitry 112 storing some charge which corresponds to IN 102 and/or Ref 104—e.g. where the charge indicates a comparison of IN 102 and Ref 104 to one another. By way of illustration and not limitation, sampler circuitry 112 may include or couple to capacitor CP1 118 to store a charge, where a level of the charge is based at least in part on respective sampling of IN 102 and Ref 104.

Comparator circuit 100 may further include first gain circuitry G1 114 coupled to sampler circuitry 112—e.g. via CP1 118—where G1 114 is to generate an intermediate signal based on the sampling by sampler circuitry 112. In an embodiment, G1 114 includes an amplifier—e.g. an inverter amplifier—or other such circuitry to provide gain for a signal resulting from sampling IN 102. G1 114 may output the amplified signal to node N1 116 between respective elements of first stage 110 and second stage 120.

In an embodiment, G1 114 receives one or more control signals (not shown) provided to bias comparator circuit 100—e.g. where such biasing prepares comparator circuit 100 for sampling of IN 102 and/or Ref 104. Biasing operations (also referred to herein as "auto-zero" operations) may bring one or more elements of G1 114 into an operational state to limit clipping, saturation or other undesirable signal/circuit performance characteristics. G1 114 may further include circuitry to limit charge injection during auto-zero operations, although certain embodiments are not limited in this regard.

Comparator circuit 100 may further include second stage 120 to receive the intermediate signal from G1 114. In an embodiment, second stage 120 includes switch circuitry SW 122 coupled to first stage 110 via N1 116. SW 122 may be implemented with an NMOS transistor or, alternatively, with a PMOS transistor, according to different embodiments. Second stage 120 may receive switch control signal SC 130 for regulating operation of SW 122. By way of illustration and not limitation, SC 130 may be provided to coordinate switched coupling and/or decoupling between first stage 110 and second stage 120 with auto-zero and/or sampling operations of first stage 110.

In an embodiment, receiving the intermediate signal from G1 114 may result in second stage 120 storing some charge based on the intermediate signal. By way of illustration and not limitation, second stage 120 may include capacitor CP2 124 coupled to SW 122. When SW 122 is closed, CP2 124 may accumulate a charge in response to the intermediate signal received from G1 114 via N1 116.

Second stage 120 may further include second gain circuitry G2 128 coupled to CP2 124 via node N2 126, where G2 128 generates a second intermediate signal based on the first intermediate signal from G1 114. G2 128 may include an amplifier—e.g. an inverter amplifier—or other such circuitry to generate an amplified version of the first intermediate signal from G1 114. This second intermediate signal may be a provided to node N3 132 between respective elements of second stage 120 and third stage 140.

In an embodiment, G2 128 may receive one or more control signals (not shown) to coordinate auto-zero operations for comparator circuit 100. Additionally or alternatively, G2 128 may include circuitry to limit charge injection through second stage 120, although certain embodiments are not limited in this regard Comparator circuit 100 may further include third stage 140 to receive via N3 132 the second intermediate signal from G2 128. Third stage 140 may include combinatorial logic 142 to provide, based on the second intermediate signal, an output signal comp 150 at node N4 144. Combinatorial logic 142 may include one or more digital logic gates for comp 150 to have one or more digital signal characteristics for clearly representing a binary logical state. In an embodiment, third stage 140 receives output enable control signal OE 146 for controlling operation of combinatorial logic 142. For example, OE 146 may prevent the output of comp 150 until auto-zero operations to bias comparator circuit 100 have completed.

Comparator circuit 100 may further include feedback circuitry 160 coupled between N4 144 and N2 126. Feedback circuitry 160 may provide feedback to dynamically provide a pull-down path for N2 126. Such feedback via feedback circuitry 160 may, for example, prevent circuit saturation due to an otherwise unacceptably high comp 150. In an embodiment, feedback circuitry 160 receives one or more control signals to regulate feedback between N4 144 and N2 126. By way of illustration and not limitation, feedback circuitry 160 may also receive OE 146, where feedback from N4 144 to change a characteristic of N2 126 is selectively controlled by OE 146 in coordination with allowing output of comp 150 from third stage 140.

Figure 2:
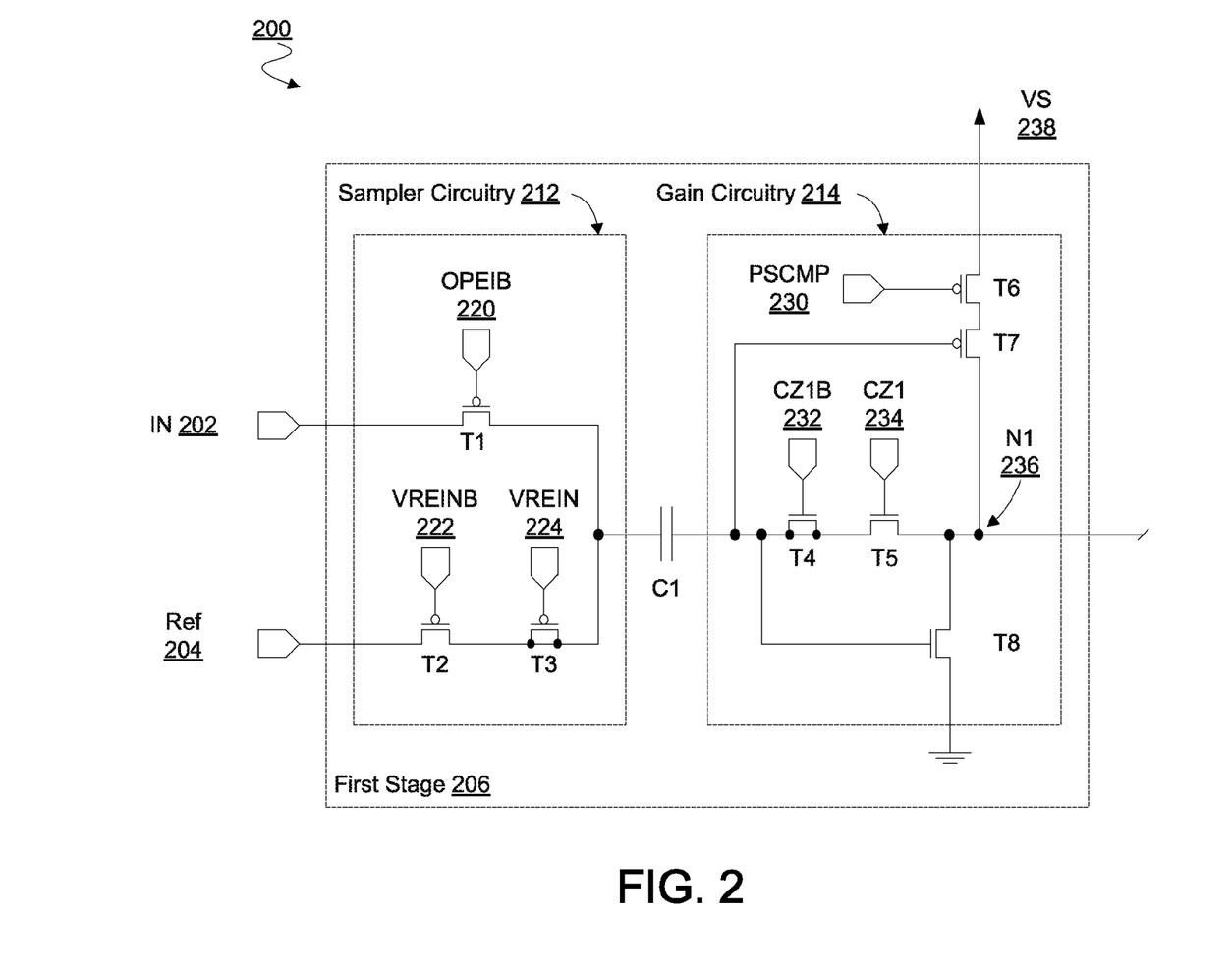
FIG. 2 is a circuit diagram illustrating elements of a comparator circuit according to an embodiment.

FIG. 2 illustrates elements of a comparator circuit 200 according to an embodiment. Comparator circuit 200 may include first stage 206 to receive input signal IN 202 and reference signal Ref 204, where comparator circuit 200 is to generate an output signal (not shown) representing a comparison of IN 202 and Ref 204. Comparator circuit 200 may include some or all of the features of comparator circuit 100—for example, where operation of first stage 206 provides some or all of the functionality of first stage 110.

In an embodiment, first stage 206 includes sampler circuitry 212 to selectively sample IN 202 and Ref 204, and gain circuitry 214 to generate an amplified signal indicating a comparison of respective levels of IN 202 and Ref 204. By way of illustration and not limitation, gain circuitry 214 may provide such an amplified signal at node N1 236 for some later stage (not shown) of comparator circuit 200. In an embodiment, N1 236 corresponds to N1 116 of comparator circuit 100.

Sampling of IN 202 and Ref 204 may include operating sampler circuitry 212 with one or more control signals. In an illustrative embodiment, sampler circuitry 212 includes active-low transistor T1 of a branch which is to selectively sample IN 202 under the control of open input enable signal OPEIB 220. Sampler circuitry 212 may further comprise transistor T2 of a branch which is to selectively sample Ref 204 under the control of complementary reference voltage input enable signal VREINB 222. The branch including T2 may further include dummy transistor T3 to limit current injection into first stage 206 which might otherwise resulting from switching to sample Ref 204 into first stage 206. In such an embodiment, T3 may operate under control of reference voltage input enable signal VREIN 224 which, for example, is complementary to VREINB 222. In an alternate embodiment, the NMOS transistors of comparator circuit 200 are each replaced with a respective PMOS transistor—e.g. where the PMOS transistors of comparator circuit 200 are each replaced with a respective NMOS transistor, and where the various control signals for comparator circuit 200 are the logical inverse to those shown in FIG. 2.

In an embodiment, sampling of IN 202 and Ref 204 may result in sampler circuitry 212 storing some amount of charge. By way of illustration and not limitation, sampler circuitry 212 may include or couple to capacitor C1 to store a charge, where a level of the charge represents a difference between respective levels of the sampled IN 202 and Ref 204. Sampler circuitry 212 may be coupled to gain circuitry 214—e.g. via C1—where gain circuitry 214 is to generate some intermediate signal based on charge in C1. Gain circuitry 214 may include any of a variety of types of amplifier circuitry to provide gain for a signal output to N1 236.

By way of illustration and not limitation, gain circuitry 214 may include transistor T7 and transistor T8 to selectively operate together as an inverter amplifier circuit for providing at N1 236 a signal based on charge accumulated at C1. Such an inverter amplifier may operate in concert with a current source which, for example, comprises transistor T6 and power supply 238. In an embodiment, such a current source operates under the control of an analog bias control signal PSCMP 230. Some or all of the current source may be external to gain circuitry 214 (e.g. external to one of both of first stage 206 and comparator circuit 200), in an alternate embodiment.

Gain circuitry 214 may include one or more circuit elements to auto-zero first stage 206. By way of illustration and not limitation, gain circuitry 214 may include transistor T5 coupled between C1 and N1 236. T5 may operate—e.g. in response to comparator zero control signal CZ1 234—to bypass the inverter amplifier circuitry which includes T7 and T8. Auto-zero operations may activate T5 for a period of time to bring gain circuitry 214 to an baseline bias—e.g. including a baseline DC voltage—for accommodating a range of values for a difference between IN 202 and Ref 204. Gain circuitry 214 may further comprise dummy transistor T4, coupled between C1 and N1 236, to limit current injection through gain circuitry 214 during auto-zeroing of comparator circuit 200. T4 may operate, for example, in response to complementary comparator zero control signal CZ1B 232, where CZ1B 232 is complementary to CZ1 234.

Figure 3:
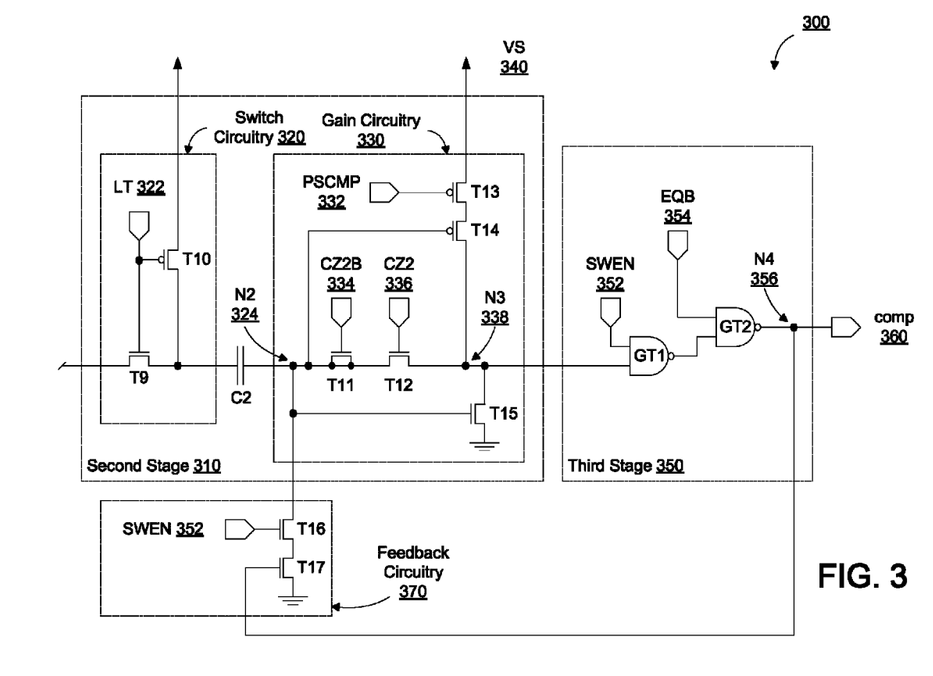
FIG. 3 is a circuit diagram illustrating elements of a comparator circuit according to an embodiment.

FIG. 3 illustrates elements of a comparator circuit 300 according to an embodiment. Comparator circuit 300 may include some or all of the features of comparator circuit 100, for example. In an embodiment, comparator circuit 300 includes a first stage (not shown) including some or all of the features of 206.

In an embodiment, comparator circuit 300 includes second stage 310 to receive—e.g. from a stage such as first stage 206—an amplified signal based on a sampled input signal and a reference signal. By way of illustration and not limitation, second stage 310 may include capacitor C2 to store a charge based on the intermediate signal. Second stage 310 may further include switch circuitry 320 to switchedly open (or close) a path between one or more elements of second stage 310 and the preceding stage of comparator circuit 300.

By way of illustration and not limitation, switch circuitry 320 may include transistor T9 coupled between an input node for second stage 310—e.g. node N1 236—and C2. Switch circuitry 320 may further include transistor T10 to selectively provide a pull-up path for C2 when T9 is in an inactive (e.g. open) state. T9 and T10 may each operate under control of latch control signal LT 322 to, at some point, at least partially isolate second stage 310 from an earlier stage (not shown) such as first stage 206. For example, LT 322 may provide isolation between stages of comparator circuit 300 to prevent threshold jumping, over-saturation or other signal anomalies from propagating through comparator circuit 300. LT 322 may, for example, be a clock signal, although certain embodiments are not limited in this regard. In an alternate embodiment, the NMOS transistors of comparator circuit 300 are each replaced with a respective PMOS transistor—e.g. where the PMOS transistors of comparator circuit 300 are each replaced with a respective NMOS transistor, and where the various control signals for comparator circuit 300 are the logical inverse to those shown in FIG. 3.

In an embodiment, gain circuitry 330 of second stage 310 is coupled to switch circuitry 320—e.g. via C2—where gain circuitry 330 generates an intermediate signal based on the signal received by second stage 310. Gain circuitry 330 may include any of a variety of types of amplifier circuitry to provide gain for a signal output to node N3 338.

By way of illustration and not limitation, gain circuitry 330 may include transistor T14 and transistor T15 to selectively operate together as an inverter amplifier circuit for providing at N3 338 a signal based on charge accumulated at C2. In the illustrative embodiment, gain circuitry 330 is coupled to C2 via node N2 324. Such inverter amplifier circuitry may operate in concert with a current source comprising transistor T13 and power supply 340, for example. Power supply 340 may be the same as power supply 238, for example. In an alternate embodiment, some or all of the current source may be external to gain circuitry 330 (e.g. external to one of both of second stage 310 and comparator circuit 300). The current source may operate based on one or more control signals—e.g. including analog bias control signal PSCMP 332. PSCMP 332 may, for example, be PSCMP 230 (from FIG. 2). In such an embodiment—e.g. where first stage 206 is a first stage of comparator circuit 300—T6, power supply 238, T13 and power supply 340 may form at least part of a current mirror to drive a respective current through each of first stage 206 and second stage 310.

In an embodiment, gain circuitry 330 includes one or more circuit elements for operations to auto-zero second stage 310. By way of illustration and not limitation, gain circuitry 330 may include transistor T12 coupled between C2 and N3 338. T12 may operate—e.g. in response to comparator zero control signal CZ2 336—to provide a bypass for the inverter amplifier circuitry which includes T14 and T15. Auto-zero operations may activate T12 for a period of time to bring gain circuitry 330 to an baseline state—e.g. including a baseline DC voltage—for accommodating a voltage range of an input signal which comparator signal 300 is to sample and compare to a reference signal. Gain circuitry 330 may further comprise dummy transistor T11, coupled between C2 and N3 338, to limit current injection through gain circuitry 330 during auto-zeroing of second stage 310. T11 may operate in response to complementary comparator zero control signal CZ2B 334, where CZ2 336 is complementary to CZ2B 334.

Comparator circuit 300 may further include third stage 350 coupled to second stage 310 via N3 338, where third stage 350 is to generate output signal comp 360 representing a comparison of the input signal and the reference signal variously sampled by comparator circuit 300. By way of illustration and not limitation, third stage 350 may include NAND gate GT1 to receive the intermediate signal at N3 338. GT1 may further receive switch enable control signal SWEN 352 to control GT1 outputting a signal based on the intermediate signal at N3 338. Third stage 350 may further include NAND gate GT2 to receive the output from GT1. GT2 may further receive equalization control signal EQB 354, which controls GT2 outputting comp 360 at N4 356.

In an embodiment, comparator circuit 300 further includes feedback circuitry 370 coupled between N4 356 and node N2 324. Operation of feedback circuitry 370 may dynamically provide a pull-down path for N2 324 in response to comp 360. Feedback via feedback circuitry 370 may, for example, prevent saturation due to an otherwise unacceptably high level of comp 360. Feedback circuitry 370 may receive one or more control signals to regulate feedback between N4 356 and N2 324. By way of illustration and not limitation, feedback circuitry 370 may include transistors T16 and T17 coupled in series with one another between N2 324 and a reference voltage level, such as a ground. T17 may be activated in response to output of comp 360 at N4 356. In an embodiment, T16 may be selectively activated, in response to SWEN 352, to variously allow pull-down current to be carried from N2 324 to ground, where such pull-down current is based on feedback of comp 360 to T17.

Figure 4:
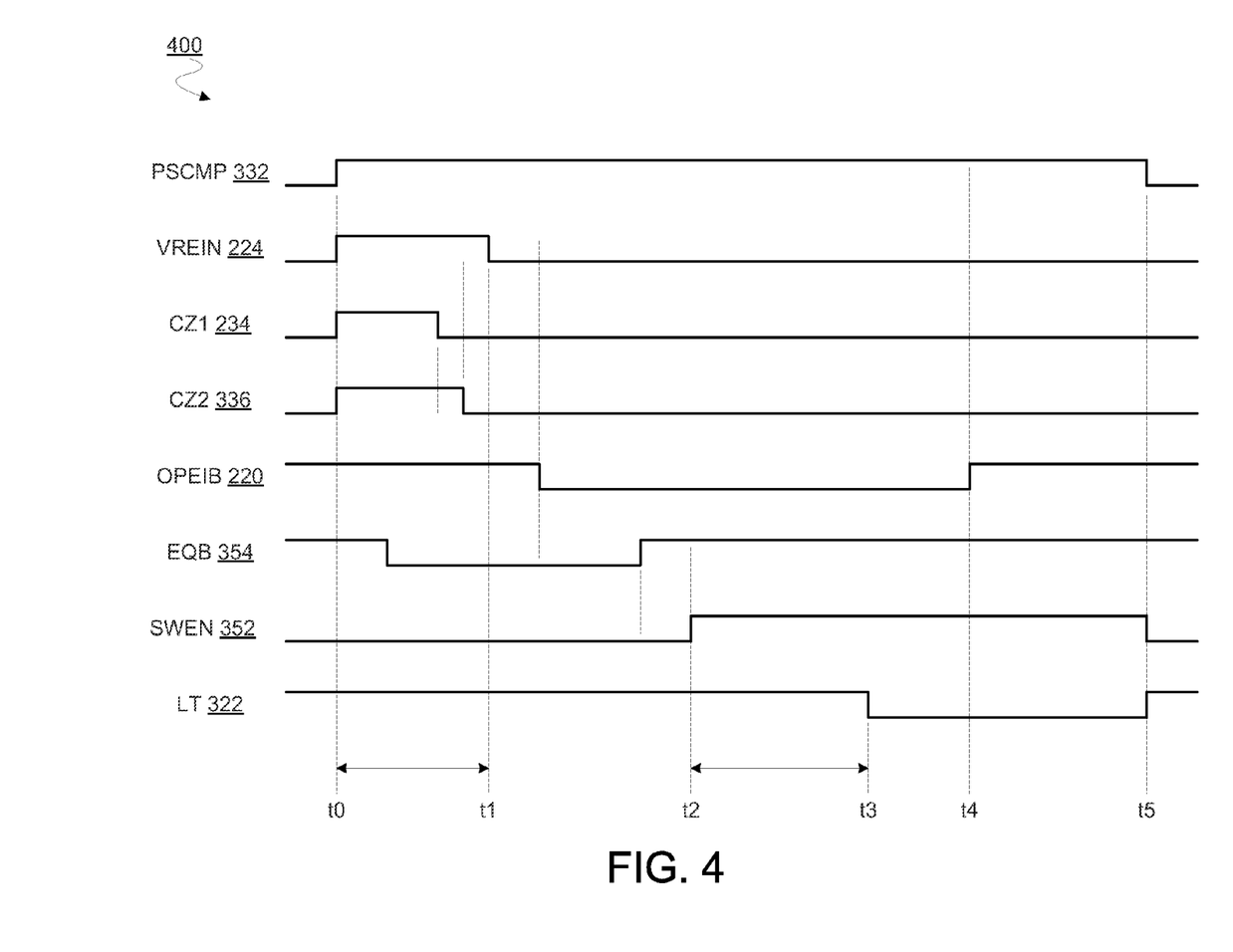
FIG. 4 is a timing diagram illustrating elements of control signaling for operation of a comparator circuit according to an embodiment.

FIG. 4 illustrates elements of signaling 400 to regulate operation of a comparator circuit according to an embodiment. To demonstrate various features of certain embodiments, signaling 400 is discussed in relation to a comparator circuit including elements of comparator circuit 200 and comparator circuit 300 in FIGS. 2 and 3 respectively. In an embodiment, signaling 400 is to operate a comparator circuit which includes first stage 206 and second stage 310 coupled thereto, where second stage 310 is to receive an intermediate signal from first stage 206. Such a comparator circuit further includes third stage 350 and feedback circuitry 370 for generating comp 360 based on another intermediate signal of second stage 310.

In an embodiment, signaling 400 includes PSCMP 332 being asserted at some time t0 to drive a current mirror (e.g. including power supplies 238, 340 and transistors T6, T13) which facilitates operation of gain circuitry 214 and gain circuitry 330. Driving such a current mirror may, for example, allow for auto-zeroing of gain circuitry 214 and gain circuitry 330.

In an embodiment, auto-zeroing biases the inverter amplifier of gain circuitry 214 which includes transistors T7, T8, and further biases the inverter amplifier of gain circuitry 330 which includes transistors T14 and T15. Such auto-zeroing may, for example, include asserting VREIN 224 in combination with asserting CZ1 234 and CZ2 336. Sampling of Ref 204 may take place in response to VREIN 224 being asserted, while the concurrently asserted CZ1 234 and CZ2 336 may allow the inverter amplifiers of gain circuitry 214 and gain circuitry 330 to reach respective bias points based on the sampled Ref 204.

After biasing of the comparator circuit for Ref 204, VREIN 224, CZ1 234 and CZ2 336 may be deasserted in preparation for sampling IN 202. In signaling 400, auto-zeroing is performed between time t0 and time t1, when VREIN 224 is deasserted. During auto-zero and sampling of IN 202, LT 322 may be asserted for a closed switch circuitry 320 which couples C2 of second stage 310 to N1 236.

Sampling IN 202 may include, for example, deasserting OPEIB 220 to operate active-low T1 of sampler circuitry 212. Such deasserting of OPEIB 220 may allow IN 202 to charge C1, which in turn may cause the inverter amplifier of gain circuitry 214 to provide an intermediate signal at N1 236. With switch circuitry 320 closed by the asserted LT 322, the intermediate signal at N1 236 may charge C2, which in turn may cause the inverter amplifier of gain circuitry 330 to provide another intermediate signal at N3 338.

After allowing the intermediate signal at N3 338 to stabilize, combinatorial logic of third stage 350 may be activated to provide comp 360 at N4 356. By way of illustration and not limitation, SWEN 352 may be asserted—e.g. at time t2—for NAND gate GT1 to output an inverted version of the intermediate signal at N3 338. In an embodiment, EQB 354 may be asserted at some point prior to time t2, where the combined assertion of both SWEN 352 and EQB 354 begins an output of digital signal comp 360 at N4 356.

Assertion of SWEN 352 at T2 may further enable activation of feedback circuitry 370—e.g. to facilitate pull-down of N2 324 based on feedback of comp 360 from N4 356. At a later time t3, LT 322 may be deasserted to at least partially decouple first stage 206 from second stage 310 via switch circuitry 320. Subsequently, OPEIB 220 may be asserted at a time T4 to stop sampling of IN 202 via active-low transistor T1, and LT 322 may be reasserted at a time T5 to switchedly close the connection between N1 236 and C2.

Figure 5:
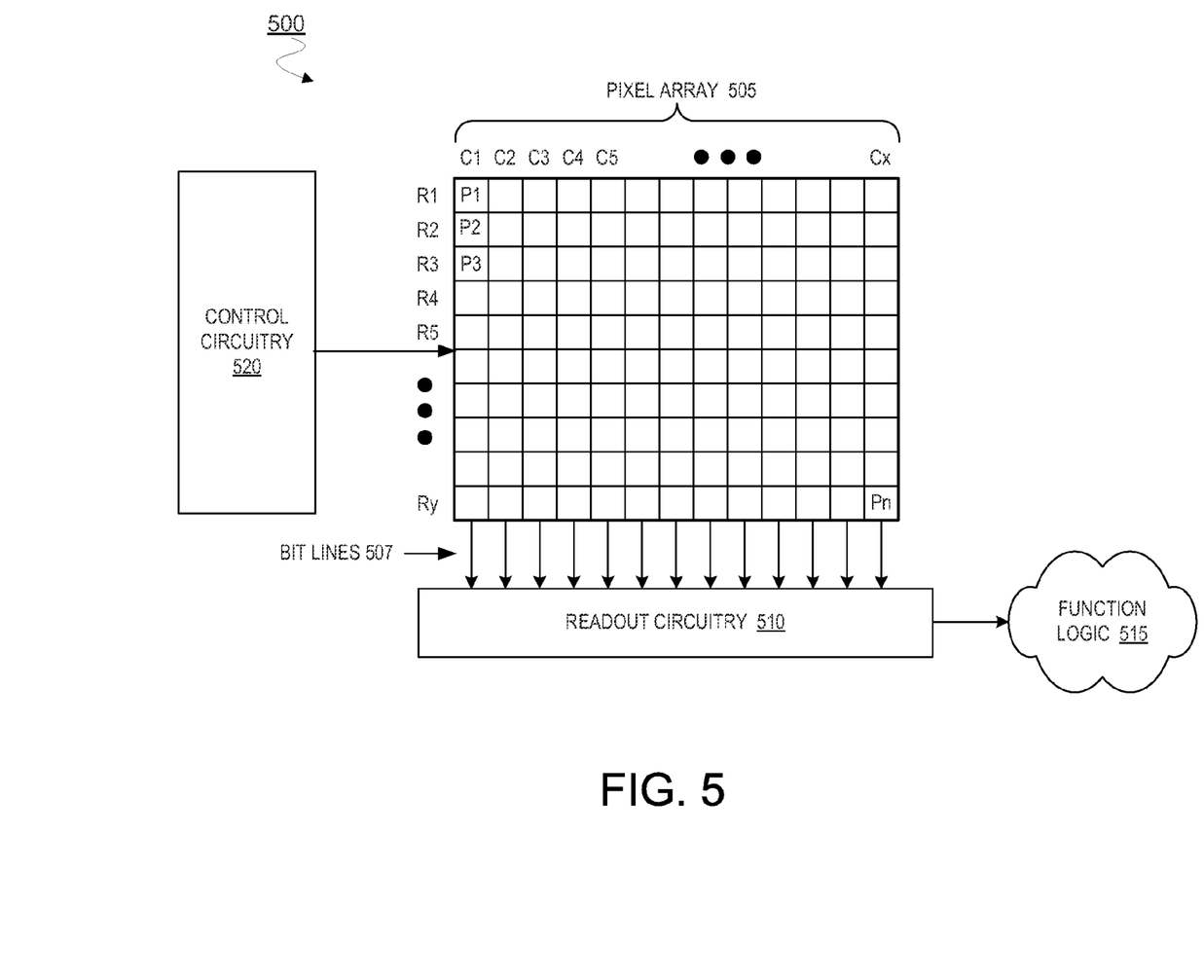
FIG. 5 is a block diagram illustrating elements of an image sensor system according to an embodiment.

FIG. 5 is a block diagram illustrating an image sensor system 500 including signal amplification circuitry according to an embodiment. The illustrated embodiment of image sensor system 500 includes a pixel array 505, readout circuitry 510, function logic 515, and control circuitry 520.

Pixel array 505 may comprise rows and columns of pixel cells (e.g., pixels P1, P2 . . . , Pn). In one embodiment, each pixel is a complementary metal-oxide-semiconductor ("CMOS") pixel. Pixel array 505 may be implemented as a frontside illuminated image sensor or a backside illuminated image sensor. As illustrated, each pixel is arranged into a row (e.g., rows R1 to Ry) and a column (e.g., column C1 to Cx) to acquire image data of a person, place, or object, which can then be used to render an image of the person, place, or object.

After each pixel has acquired its image data or image charge, the image data may be readout via bit lines 507 by readout circuitry 510 and transferred to function logic 515. Readout circuitry 510 may include amplification circuitry, analog-to-digital ("ADC") conversion circuitry, or otherwise. In an embodiment, readout circuitry 510 includes signal gain components to amplify a signal from one of bit lines 507. Configuration of such signal gain components may be controlled by control circuitry 520, for example. In another embodiment, circuitry to control pixel array 505 may be distinct from other control circuitry to selectively configure signal gain components of readout circuitry 510.

Function logic 515 may simply store the image data or even manipulate the image data by applying post image effects (e.g., crop, rotate, remove red eye, adjust brightness, adjust contrast, or otherwise). In one embodiment, readout circuitry 510 may readout a row of image data at a time along readout column lines (illustrated as generic bit lines) or may readout the image data using a variety of other techniques (not illustrated), such as a serial readout, column readout along readout row lines, or a full parallel readout of all pixels simultaneously.

Control circuitry 520 may be coupled to pixel array 505 and may include logic for controlling operational characteristic of pixel array 505. For example, reset, row select, and transfer signals may be generated by control circuitry 520, as discussed below. Additionally, dual conversion gain signals or FD boost signals, as discussed below, may also be generated by control circuitry 520. In one embodiment, control circuitry 520 may include photosensitive circuitry to measure the intensity of light impinging upon pixel array 505 and adjust the control signals accordingly.

Figure 6:
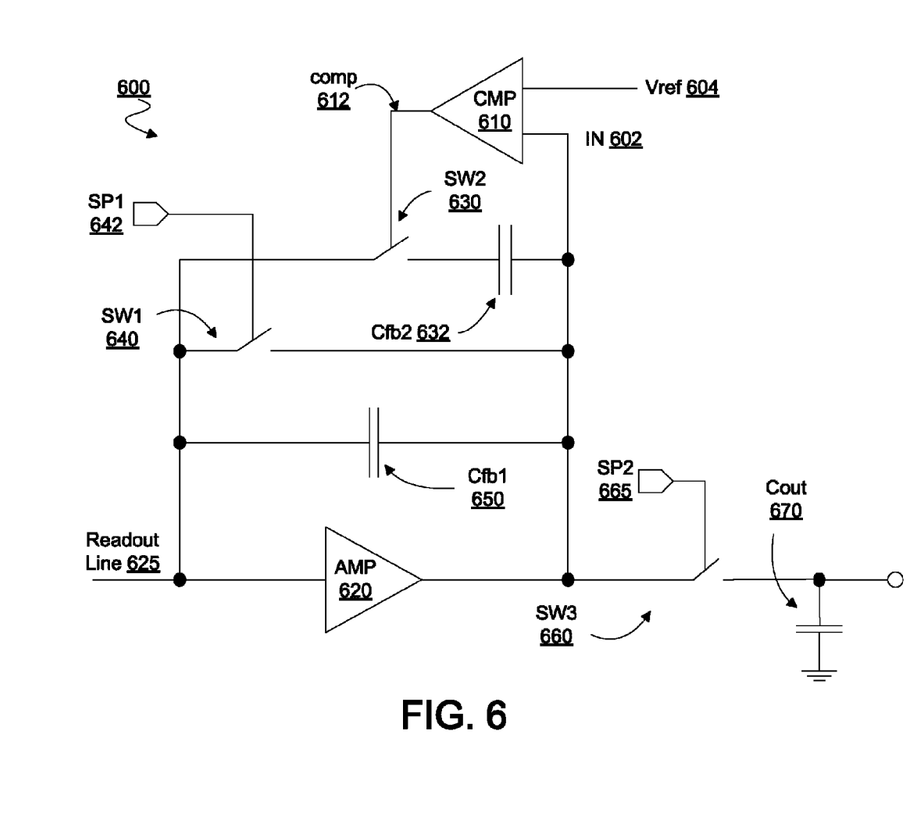
FIG. 6 is a circuit diagram illustrating elements of a readout circuit according to an embodiment.

FIG. 6 illustrates elements of readout circuitry 600 including comparator circuit CMP 610 according to an embodiment. Readout circuitry 600 may provide functionality, such as that of readout circuitry 510, for reading image data from a pixel cell (e.g. a CMOS pixel cell)—e.g. via one of bit lines 507. In an embodiment, CMP 610 includes some or all of the features of comparator circuit 100.

Readout circuitry 600 may include operational amplifier AMP 620 to receive an image data signal read out of a pixel array via readout line 625. In an embodiment, readout circuitry 600 includes switch SW2 630 to allow for a selectable dynamic gain for a CMOS image sensor. SW2 630 may be implemented with an NMOS transistor or, alternatively, with a PMOS transistor, according to different embodiments. For example, readout circuitry 600 may comprise a switchable feedback path across AMP 620 which includes SW2 630 and a load such as feedback capacitor Cfb2 632.

CMP 610 may receive signal IN 602 from an output of AMP 620 and compare IN 602 to a threshold reference voltage Vref 604. In an embodiment, CMP 610 outputs signal comp 612 representing a comparison of IN 602 with Vref 604. The output comp 612 may operate SW2 630 to determine whether feedback across AMP 620 implements a high dynamic gain or a low dynamic gain of readout circuitry 600.

In an embodiment, SW2 630 is operable to selectively control an exchange between the input and output of amplifier 620 via Cfb2 632. At some point in time, CMP 610 may determine whether IN 602 is greater than Vref 604. CMP 610 may output comp 612 in response to IN 602 being greater than threshold voltage Vref 604. Assertion of comp 612 may close SW2 630, resulting in a reduction of gain across amplifier 620. A low gain mode may be advantageous for achieving high dynamic gain—e.g. as is desired in bright light image-capture situations. Alternatively, comp 612 may be de-asserted when IN 602 is less than Vref 604. Deasserting comp 612 may open SW2 630, preventing Cfb2 632 from reducing the gain across amplifier 620. A high gain amplifier may be advantageous for achieving low dynamic gain—e.g. as is desired in low light image-capture situations.

In an embodiment, readout circuitry 600 further includes one or more additional feedback and/or feedforward paths (not shown) across amplifier 620. By way of illustration and not limitation, a feedback capacitor and a equalizer switch are additional components which are normally included for a column amplifier circuit, or other such readout circuitry. In one embodiment, readout circuitry 600 further includes equalizer switch SW1 640 coupled, in parallel with SW2 630 and Cfb2 632, between the input and output of AMP 620. Such an equalization switch SW1 640 may, for example, selectively couple the input and output of operational amplifier 620 for amplifier offset cancellation in response to switch control signal SP1 642. SW1 640 may be implemented with an NMOS transistor or, alternatively, with a PMOS transistor, according to different embodiments. In an embodiment, EQB 354 is a delayed and inverted version of SP1 642.

Additionally or alternatively, readout circuitry 600 may further include feedback capacitor Cfb1 650 coupled between the input and output of operational amplifier 620 in parallel with SW2 630 and Cfb2 632 and, in an embodiment, further in parallel with SW1 640. In an embodiment, Cfb1 650 implements some baseline loop gain for signal amplification with AMP 620. Readout circuitry 600 may include additional logic to provide an output based on IN 602 from AMP 620. By way of illustration and not limitation, a switch SW3 660 may further be coupled to the output of AMP 620, where SW3 660 is operated by switch control signal SP2 665 to selectively charge an output capacitor 670.

Figure 7:
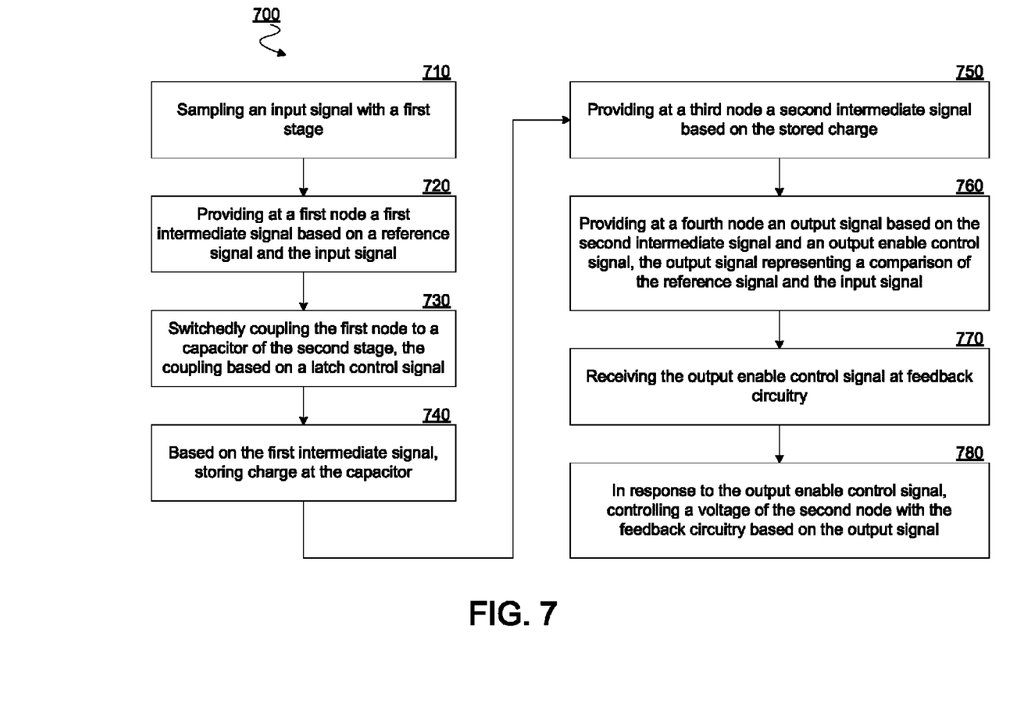
FIG. 7 is a flow diagram illustrating elements of an algorithm for operation of a comparator circuit according to an embodiment.

FIG. 7 illustrates elements of a method 700 for operating a comparator circuit according to an embodiment. Method 700 may operate a comparator circuit having some or all of the features of comparator circuit 100. In an embodiment, method 700 includes, at 710, sampling an input signal with a first stage of the comparator circuit. The sampling at 710 may, for example, include performing an auto-zero of the comparator circuit based on a reference signal. In an embodiment, sampling of the input signal is performed after auto-zeroing has biased the comparator circuit based on the reference voltage.

Method 700 may further include, at 720, providing at a first node a first intermediate signal based on the reference signal and the input signal. The first intermediate signal may be provided at 720 by first gain circuitry of the first stage. For example, the first stage may include a capacitor—e.g. C1 of first stage 206—which stores charge having a level based on the sampling of the input signal at 710. In an embodiment, first gain circuitry such as an inverter amplifier may provide the first intermediate signal in response to such capacitor charge.

In an embodiment, method 700 further includes, at 730, switchedly coupling the first node to a capacitor of a second stage. The switched coupling at 730 may be performed with switch circuitry of the second stage based on a latch control signal. Method 700 may further include, at 740, storing charge at the capacitor of the second stage based on the first intermediate signal.

In an embodiment, method 700 further includes, at 750, providing at a third node a second intermediate signal based on the charge stored at 740. The second intermediate signal may, for example, be provided at 750 with second gain circuitry of the second stage, where the second gain circuitry is coupled to the capacitor of the second stage via a second node.

Method 700 may further include, at 760, providing at a fourth node an output signal based on the second intermediate signal and an output enable control signal, the output signal representing a comparison of the reference signal and the input signal. In an embodiment, the output signal provided at 760 is generated with combinatorial logic of a third stage—e.g. the combinatorial logic including NAND gates GT1, GT2.

In an embodiment, method 700 includes, at 770, receiving the output enable control signal at feedback circuitry of the comparator circuit. In response to the output enable control signal, method 700 may include, at 780, controlling a voltage of the second node with the feedback circuitry. The controlling at 780 may be based on the output enable control signal—i.e. in addition to such controlling being responsive to the feedback circuitry receiving the output enable control signal.

Techniques and architectures for generating a comparison signal are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A comparator circuit comprising:
a first stage to sample an input signal, the first stage including first gain circuitry to provide at a first node a first intermediate signal based on a reference signal and the input signal;
a second stage including:
a capacitor to store charge based on the first intermediate signal;
switch circuitry between the first node and the capacitor, the switch circuitry to switchedly couple the first node to the capacitor based on a switch control signal;
second gain circuitry coupled to the capacitor via a second node, the second gain circuitry to provide at a third node a second intermediate signal based on the stored charge of the capacitor;
a third stage including combinatorial logic coupled to the third node, the combinatorial logic to receive an output enable control signal and to provide at a fourth node an output signal based on the second intermediate signal and the output enable control signal, the output signal representing a comparison of the reference signal and the input signal; and
feedback circuitry coupled between the second node and the fourth node, the feedback circuitry to receive the output enable control signal and, in response to the output enable control signal, to control a voltage of the second node based on the output signal.

2. The comparator circuit of claim 1, the first gain circuitry including a first amplifier and a first transistor to bypass the first amplifier, wherein the first gain circuitry is biased based on activation of the first transistor with a first zero control signal.

3. The comparator circuit of claim 2, the first gain circuitry further including a first dummy transistor coupled in series with the first transistor to bypass the first amplifier, the first dummy transistor to limit a charge injection through the first gain circuitry.

4. The comparator circuit of claim 2, the second gain circuitry including a second amplifier and a second transistor to bypass the second amplifier, wherein the second gain circuitry is biased based on activation of the second transistor with a second zero control signal.

5. The comparator circuit of claim 4, the second gain circuitry further including a second dummy transistor coupled in series with the second transistor to bypass the second amplifier, the second dummy transistor to limit a charge injection through the second gain circuitry.

6. The comparator circuit of claim 1, wherein the feedback circuitry to control the voltage of the second node based on the output signal includes the feedback circuitry to provide a pull-down path for the second node based on the output signal.

7. The comparator circuit of claim 1, the switch circuitry further to provide a pull-up path for the capacitor.

8. An image sensor system comprising:
a pixel array including a plurality of pixels to generate an input signal; and
a comparator circuit coupled to the pixel array, the comparator circuit including:
a first stage to sample an input signal, the first stage including first gain circuitry to provide at a first node a first intermediate signal based on a reference signal and the input signal;
a second stage including:
a capacitor to store charge based on the first intermediate signal;
switch circuitry between the first node and the capacitor, the switch circuitry to switchedly couple the first node to the capacitor based on a switch control signal;
second gain circuitry coupled to the capacitor via a second node, the second gain circuitry to provide at a third node a second intermediate signal based on the stored charge of the capacitor;
a third stage including combinatorial logic coupled to the third node, the combinatorial logic to receive an output enable control signal and to provide at a fourth node an output signal based on the second intermediate signal and the output enable control signal, the output signal representing a comparison of the reference signal and the input signal; and
feedback circuitry coupled between the second node and the fourth node, the feedback circuitry to receive the output enable control signal and, in response to the output enable control signal, to control a voltage of the second node based on the output signal.

9. The image sensor system of claim 8, the first gain circuitry including a first amplifier and a first transistor to bypass the first amplifier, wherein the first gain circuitry is biased based on activation of the first transistor with a first zero control signal.

10. The image sensor system of claim 9, the first gain circuitry further including a first dummy transistor coupled in series with the first transistor to bypass the first amplifier, the first dummy transistor to limit a charge injection through the first gain circuitry.

11. The image sensor system of claim 9, the second gain circuitry including a second amplifier and a second transistor to bypass the second amplifier, wherein the second gain circuitry is biased based on activation of the second transistor with a second zero control signal.

12. The image sensor system of claim 11, the second gain circuitry further including a second dummy transistor coupled in series with the second transistor to bypass the second amplifier, the second dummy transistor to limit a charge injection through the second gain circuitry.

13. The image sensor system of claim 8, wherein the feedback circuitry to control the voltage of the second node based on the output signal includes the feedback circuitry to provide a pull-down path for the second node based on the output signal.

14. The image sensor system of claim 8, the switch circuitry further to provide a pull-up path for the capacitor.

15. A method at a comparator circuit, the method comprising:
sampling an input signal with a first stage;
with first gain circuitry of the first stage, providing at a first node a first intermediate signal based on a reference signal and the input signal;

with switch circuitry of a second stage, switchedly coupling the first node to a capacitor of the second stage, the coupling based on a latch control signal;

based on the first intermediate signal, storing charge at the capacitor;

with second gain circuitry of the second stage, providing at a third node a second intermediate signal based on the stored charge, the second gain circuitry coupled to the capacitor via a second node;

with combinatorial logic of a third stage, providing at a fourth node an output signal based on the second intermediate signal and an output enable control signal, the output signal representing a comparison of the reference signal and the input signal;

receiving the output enable control signal at feedback circuitry coupled between the second node and the fourth node; and in response to the output enable control signal, controlling a voltage of the second node with the feedback circuitry based on the output signal.

16. The method of claim 15, wherein the first gain circuitry includes a first amplifier and a first transistor, the method further comprising biasing the first gain circuitry, including activating the first transistor with a first zero control signal to bypass the first amplifier.

17. The method of claim 16, wherein the first gain circuitry further includes a first dummy transistor coupled in series with the first transistor, the method further comprising:

with the first dummy transistor, limiting a charge injection through the first gain circuitry.

18. The method of claim 16, wherein the second gain circuitry includes a second amplifier and a second transistor, the method further comprising:

biasing the second gain circuitry, including activating the second transistor with a second zero control signal to bypass the second amplifier.

19. The method of claim 18, wherein the second gain circuitry further includes a second dummy transistor coupled in series with the second transistor, the method further comprising:

with the second dummy transistor, limiting a charge injection through the second gain circuitry.

20. The method of claim 15, wherein controlling the voltage of the second node based on the output signal includes the feedback circuitry providing a pull-down path for the second node based on the output signal.

* * * * *